United States Patent
Lamorey et al.

(10) Patent No.: US 9,078,373 B1
(45) Date of Patent: Jul. 7, 2015

(54) INTEGRATED CIRCUIT STRUCTURES HAVING OFF-AXIS IN-HOLE CAPACITOR AND METHODS OF FORMING

(71) Applicant: International Business Machines Corporation, Armonk, NY (US)

(72) Inventors: Mark C. Lamorey, Williston, VT (US); Janak G. Patel, South Burlington, VT (US); Peter Slota, Jr., Vestal, NY (US); David B. Stone, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 14/147,225

(22) Filed: Jan. 3, 2014

(51) Int. Cl.
*H05K 1/18* (2006.01)
*H05K 1/02* (2006.01)
*H05K 3/30* (2006.01)

(52) U.S. Cl.
CPC .............. *H05K 1/183* (2013.01); *H05K 1/0213* (2013.01); *H05K 3/305* (2013.01); *H05K 2201/10015* (2013.01); *H05K 2201/10507* (2013.01)

(58) Field of Classification Search
None
See application file for complete search history.

(56) References Cited

U.S. PATENT DOCUMENTS

| 6,621,012 | B2 | 9/2003 | Crockett et al. |
| 7,782,629 | B2 | 8/2010 | Graydon et al. |
| 8,064,214 | B2 | 11/2011 | Frasco |
| 8,116,091 | B2 | 2/2012 | Inagaki et al. |
| 8,279,616 | B2 | 10/2012 | Kim et al. |
| 8,331,101 | B2 | 12/2012 | Aoki et al. |
| 8,444,791 | B2 | 5/2013 | Ichiyanagi et al. |
| 8,610,250 | B2 * | 12/2013 | Lai et al. .................. 257/532 |
| 2009/0267220 | A1 | 10/2009 | Kuhlman et al. |
| 2013/0105943 | A1 | 5/2013 | Lai et al. |

FOREIGN PATENT DOCUMENTS

| JP | 2004095851 A | 3/2004 |
| JP | 2011258772 A | 12/2011 |
| JP | 5117419 B2 | 1/2013 |

* cited by examiner

*Primary Examiner* — Jack Chen
(74) *Attorney, Agent, or Firm* — Anthony J. Canale; Hoffman Warnick LLC (57) ABSTRACT

Various embodiments include integrated circuit structures having an off-axis in-hole capacitor. In some embodiments, an integrated circuit (IC) structure includes: a substrate layer having an upper surface; an IC chip at least partially contained within the substrate layer and aligned with a minor axis perpendicular to the upper surface of the substrate layer; an aperture in the substrate layer, the aperture physically separated from the IC chip; and a capacitor in the aperture and at least partially contained within the substrate layer, the capacitor being physically isolated from the IC chip, wherein the capacitor is aligned with an axis perpendicular to the upper surface of the substrate layer and offset from the minor axis of the IC chip.

9 Claims, 6 Drawing Sheets

INTEGRATED CIRCUIT STRUCTURES HAVING OFF-AXIS IN-HOLE CAPACITOR AND METHODS OF FORMING

BACKGROUND

The subject matter disclosed herein relates to integrated circuit devices. More particularly, the subject matter relates to capacitor structures and fabrication of integrated circuit devices including capacitor structures.

As integrated circuit (IC) technologies have advanced, the size of these devices has correspondingly decreased. In particular, as devices are reduced in scale to comply with ever-smaller packaging, tighter constraints are applied to their dimensions and spacings.

In the example of a capacitor device, effectiveness of that device is based upon both its electrical performance and the performance of the interconnect between the capacitor and the end device (connected with the capacitor). Conventional IC laminate structures do not integrate capacitors in an effective manner.

SUMMARY

Various embodiments include integrated circuit structures having an off-axis in-hole capacitor. In some embodiments, an integrated circuit (IC) structure includes: a substrate layer having an upper surface; an IC chip mounted on the substrate layer and aligned with a minor axis perpendicular to the upper surface of the substrate layer; an aperture in the substrate layer, the aperture physically separated from the IC chip; and a capacitor in the aperture and at least partially contained within the substrate, the capacitor being physically isolated from the IC chip, wherein the capacitor is aligned with an axis perpendicular to the upper surface of the substrate and offset from the minor axis of the IC chip.

A first aspect includes an integrated circuit (IC) structure having: a substrate layer having an upper surface; an IC chip mounted on the substrate layer and aligned with a minor axis perpendicular to the upper surface of the substrate; an aperture in the substrate layer, the aperture physically separated from the IC chip; and a capacitor in the aperture and at least partially contained within the substrate, the capacitor being physically isolated from the IC chip, wherein the capacitor is aligned with an axis perpendicular to the upper surface of the substrate and offset from the minor axis of the IC chip.

A second aspect includes a method including: forming an aperture in an integrated circuit (IC) structure, the IC structure including: a substrate layer having an upper surface; and an IC chip mounted on the substrate layer and aligned with a minor axis perpendicular to the upper surface of the substrate layer, wherein the aperture is physically separated from the IC chip and is aligned with an axis perpendicular to the upper surface of the substrate layer offset from the minor axis of the IC chip; and positioning a capacitor structure in the aperture such that at least a portion of the capacitor structure is located below the upper surface of the substrate layer and the capacitor structure is physically isolated from the IC chip.

A third aspect includes an integrated circuit (IC) structure including: a substrate layer having: a core layer; a power layer above the core layer and including an upper surface; and a ground layer below the core layer; an IC chip mounted on the substrate layer and aligned with a minor axis perpendicular to the upper surface of the substrate; an aperture in the substrate layer, the aperture physically separated from the IC chip, the aperture including a set of power contacts in the power layer and a set of ground contacts in the ground layer; and a capacitor structure in the aperture and at least partially contained within the substrate, the capacitor structure including: a set of power leads contacting the capacitor and the set of power contacts within the aperture; and a set of ground leads contacting the capacitor and the set of ground contacts within the aperture, the capacitor being physically isolated from the IC chip, wherein the capacitor is aligned with an axis perpendicular to the upper surface of the substrate and offset from the minor axis of the IC chip, wherein the capacitor is mounted to the set of power contacts by the set of power leads, and the set of ground contacts by the set of ground leads.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuit devices. More particularly, the subject matter relates to capacitor structures and fabrication of integrated circuit devices including capacitor structures.

As noted herein, conventional IC structures (e.g., IC laminate structures) do not integrate capacitors in an effective manner. In contrast to these conventional IC structures, various embodiments include structures (e.g., laminate and/or ceramic structures) including an embedded capacitor, along with methods of forming such structures.

Various particular embodiments include an integrated circuit (IC) structure having: a substrate (e.g., laminate, such as organic laminate, or ceramic) layer having an upper surface; an IC chip mounted on the substrate layer and aligned with a minor axis perpendicular to the upper surface of the substrate; an aperture in the substrate layer, the aperture physically separated from the IC chip; and a capacitor in the aperture and at least partially contained within the substrate, the capacitor being physically isolated from the IC chip, wherein the capacitor is aligned with an axis perpendicular to the upper surface of the substrate and offset from the minor axis of the IC chip.

Various other embodiments include a method including: forming an aperture in an integrated circuit (IC) structure, the IC structure including: a substrate layer having an upper surface; and an IC chip mounted on the substrate layer and aligned with a minor axis perpendicular to the upper surface of the substrate layer, wherein the aperture is physically separated from the IC chip and is aligned with an axis perpendicular to the upper surface of the substrate layer and offset from the minor axis of the IC chip; and positioning a capacitor structure in the aperture such that at least a portion of the capacitor structure is located below the upper surface of the substrate layer and the capacitor structure is physically isolated from the IC chip.

Various additional embodiments include an integrated circuit (IC) structure including: a substrate (e.g., laminate, ceramic, etc.) layer having: a core layer; a power layer above the core layer and including an upper surface; and a ground layer below the core layer; an IC chip mounted on the substrate layer and aligned with a minor axis perpendicular to the upper surface of the substrate; an aperture in the substrate layer, the aperture physically separated from the IC chip, the aperture including a set of power contacts in the power layer and a set of ground contacts in the ground layer; and a capacitor structure in the aperture and at least partially contained within the laminate, the capacitor structure including: a set of power leads contacting the capacitor and the set of power contacts within the aperture; and a set of ground leads contacting the capacitor and the set of ground contacts within the aperture, the capacitor being physically isolated from the IC chip, wherein the capacitor is aligned with an axis perpendicular to the upper surface of the laminate and offset from the minor axis of the IC chip, wherein the capacitor is mounted to the set of power contacts by the set of power leads, and the set of ground contacts by the set of ground leads.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

Figure 1:
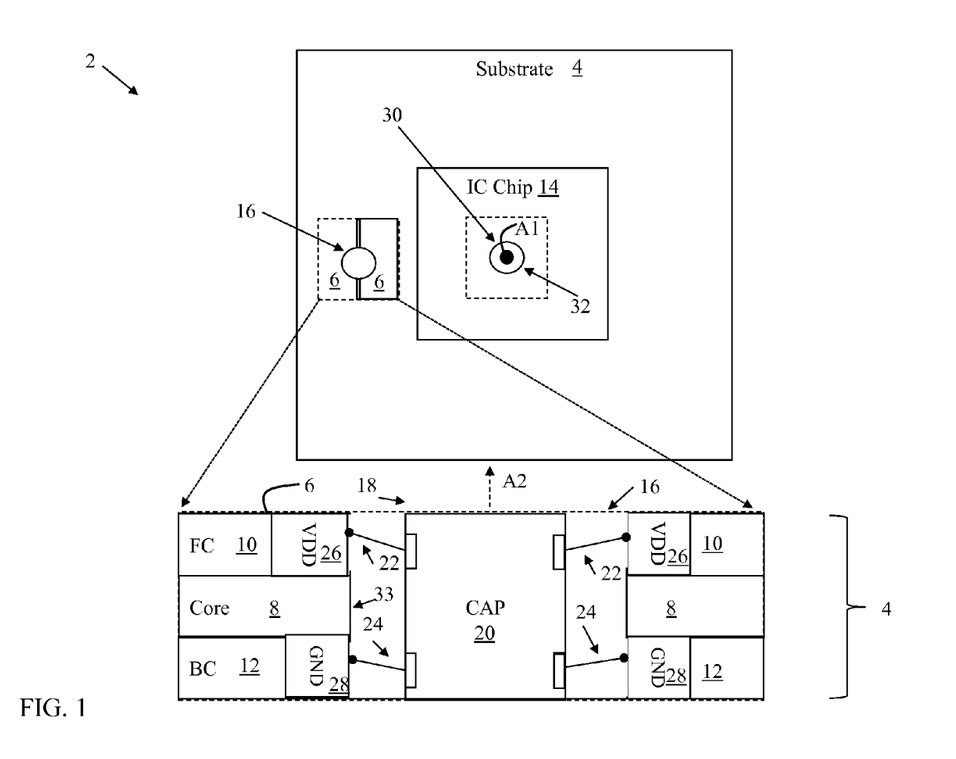
FIG. 1 shows a schematic top view, and a blow-out cross-sectional view of an integrated circuit (IC) structure according to various embodiments.

FIG. 1 shows a schematic top view, and a blow-out cross-sectional view of an integrated circuit (IC) structure 2 according to various embodiments. As shown, the IC structure 2 can include a substrate layer 4, which includes an upper surface 6 and sub-layers, described further herein. In various embodiments, the substrate layer 4 includes a laminate, e.g., an organic laminate. In other embodiments, the substrate layer 4 includes a ceramic material and/or other substrate materials known in the art. The sub-layers of the substrate layer 4 (e.g., laminate layer(s)) can include a core layer 8, at least one power layer (FC) 10 over the core layer 8 and contacting/defining the upper surface 6, and at least one ground layer (BC) 12 below the core layer 8. In various embodiments, the core layer 8 includes a dielectric such as silicon dioxide ($SiO_2$), silicon oxygen fluoride (SiOF), silicon nitride (SiN), silicon carbide (SiC), carbo-silicon nitride (C—SiN), cadmium oxide (CdO), Epoxy, polyimide or combinations thereof. The power layer 10 can include copper (Cu) (e.g., doped copper for reducing undesirable electromigration), aluminum (Al), and in some cases, tungsten (W). The ground layer 12 can include copper (Cu) (e.g., doped copper for reducing undesirable electromigration), aluminum (Al), and in some cases, tungsten (W).

The IC structure 2 can also include an IC chip 14 mounted on the substrate layer 4. The IC chip 14 can include any conventional IC chip, including, e.g., a logic device, transistor, analog device, etc. In any case, the IC chip 14 overlies and contacts the upper surface 6 of the substrate layer 4, and may be mounted to the substrate layer 4 via any conventional mounting techniques known in the art. The IC chip 14 is aligned with a minor axis A1 that is perpendicular to the upper surface 6 of the substrate layer 4 (extending into/out of the page in the top view). The IC structure 2 can further include an aperture 16 in the substrate layer 4, where the aperture 16 is physically separated from the IC chip 14 (e.g., with laminate interposed between the IC chip 14 and the aperture 16). The cross-sectional blow-out view of the aperture 16 shows the surrounding substrate layer 4 in greater detail.

As shown, according to various embodiments, the IC structure 2 can also include a capacitor structure 18 in the aperture 16, and at least partially contained within the laminate layer 4. According to various embodiments, the capacitor structure 18 is physically isolated from the IC chip 14, and the capacitor 18 is aligned with an axis A2 perpendicular to the upper surface 6 of the substrate layer 4 and offset from the axis A1 of the IC chip 14. The capacitor structure 18 can include a capacitor 20 (conventional capacitor known in the art), a set of power leads 22 contacting the capacitor 20, and a set of ground leads 24 contacting the capacitor 20. The power leads 22 and ground leads 24 can be formed any conventional lead material, e.g., copper (Cu), aluminum (Al), alloys of Cu and/or Al, etc. As described further herein, the power leads 22 and the ground leads 24 can allow for connection of the capacitor structure 18 with portions of the substrate layer 4 within the aperture 16.

The IC structure 2 can further include a set of power contacts (VDD) 26 in the power layer 10 within the aperture 16, and a set of ground contacts (GND) 28 in the ground layer 12 within the aperture 16. According to various embodiments, the power leads 22 in the capacitor structure 18 can contact (physically and electrically contact) the set of power contacts (VDD) 26 within the aperture 16, and the ground leads 24 can contact (physically and electrically contact) the set of ground contacts (GND) 28 in the aperture 16.

According to various embodiments, the aperture 16 has a diameter (d1), and a combined width (w) of the capacitor 20 and the set of power leads 22, or a combined width of the capacitor 20 and the set of ground leads 24, is greater than the diameter (d1) of the aperture 16. This is further illustrated with respect to FIGS. 3-5 and methods according to various embodiments. As illustrated in FIG. 1, at least one of the set of power leads 22 or the set of ground leads 24 (in this depiction, all of the leads) is angled within the aperture 16 with respect to a plane (P) established by the upper surface 6 of the substrate layer 4. That is, due to the differential in the size of the capacitor 20 and power/ground leads 22, 24 when compared with the diameter (d1) of the aperture 16, those leads 22, 24 will deflect when the capacitor structure 18 is positioned within the aperture 16.

Figure 2:
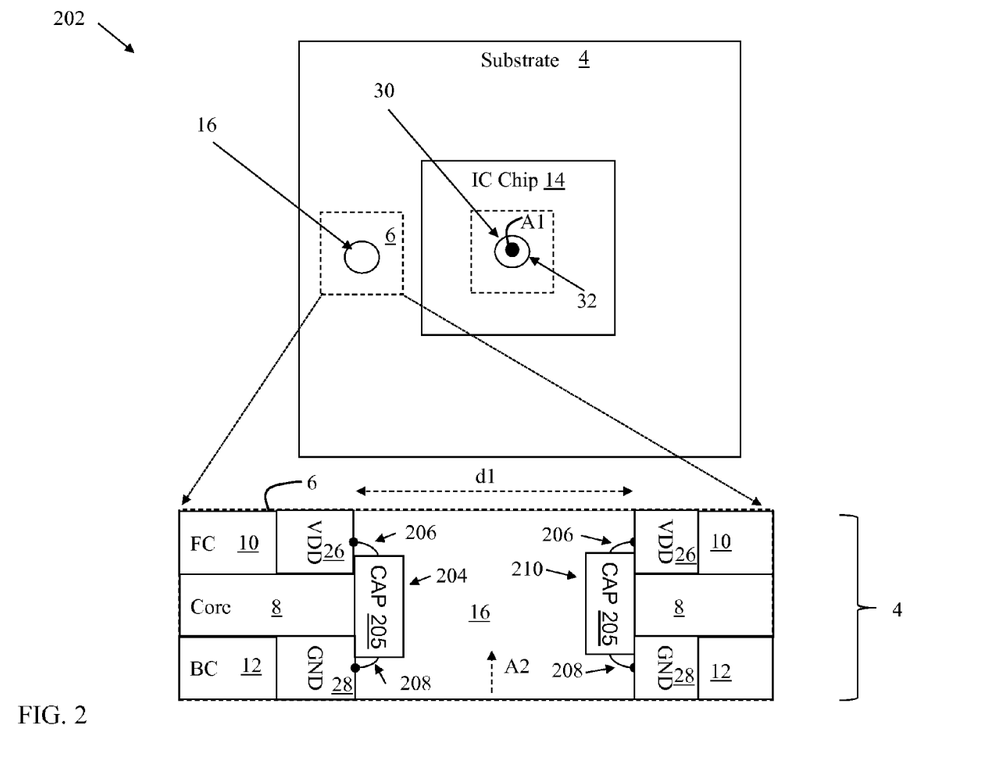
FIG. 2 shows a schematic top view, and a blow-out cross-sectional view of an IC structure according to various alternate embodiments.

FIG. 2 shows an alternate IC structure 202, including a first capacitor structure 204 (similar to capacitor structure 18), which includes a capacitor 205, a set of power leads 206 and a set of ground leads 208 (similarly described herein with respect to power leads 22 and ground leads 24). The IC structure 202 includes other similar components as described with respect to IC structure 2, and redundant explanation of those components is omitted for clarity of illustration. IC structure 202 also includes an additional capacitor structure 210 within the aperture 16, and at least partially contained within the substrate layer 4. The additional capacitor 210 (as well as first capacitor 204) is physically isolated from the IC chip 14, and is aligned with the axis A2 (offset from axis A1). The additional capacitor structure 210 can also include a capacitor 205, a set of power leads 206 and a set of ground leads 208. In these embodiments, the first capacitor 205 is coupled to a first power lead 26 in the set of power leads 26, and a first ground lead 28 in the set of ground leads 28, and the additional capacitor 210 is coupled to a second power lead 26 in the set of power leads 26, distinct from the first power lead 26, and a second ground lead 28 in the set of ground leads 28, distinct from the first ground lead 28. That is, in these embodiments, two distinct capacitor structures 204, 210 are located within the aperture 16 in the substrate layer 4.

As shown in FIG. 1 and FIG. 2, in some cases, the IC structure 2 (or, similarly IC structure 202) can include an additional aperture 30 within the IC chip 14 outline, and the additional aperture 30 can include a second (or third, fourth, etc.) capacitor 32. According to various embodiments, the IC chip 14 is located at a distinct depth relative to the upper surface 6 in the substrate layer 4 than the capacitor 32. That is, the IC chip 14 is located entirely over the upper surface 6 in the substrate layer 4, while at least a portion of the capacitor 32 is located below the upper surface 6 of the substrate layer. In some cases, the capacitor 32 is entirely below the upper surface 6.

Figure 3:
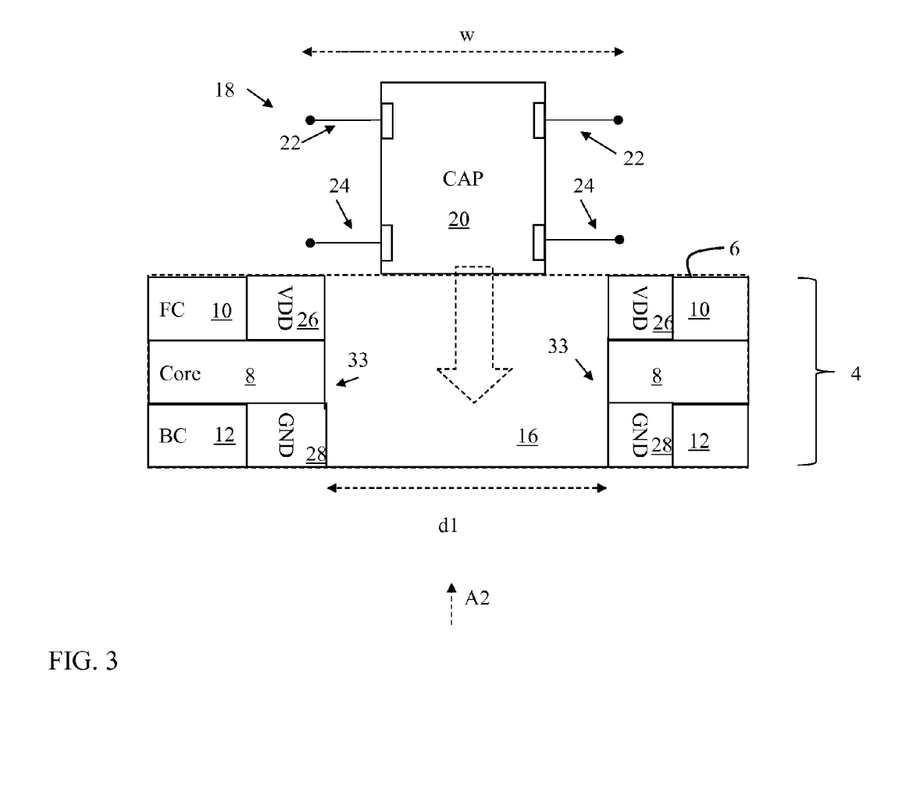
FIGS. 3-5 show cross-sectional depictions of IC structures undergoing processes according to various embodiments.
Figure 4:
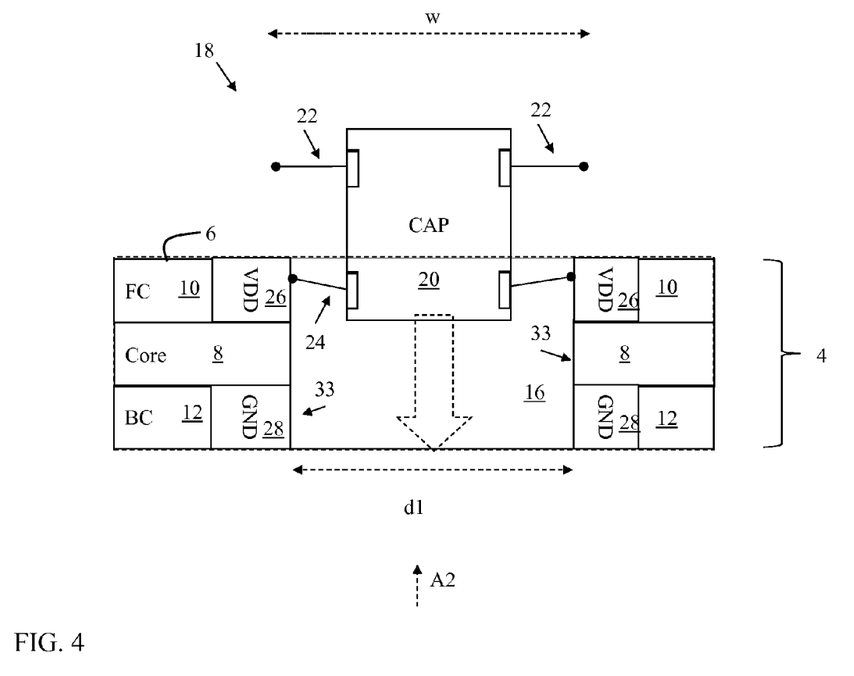
Figure 5:
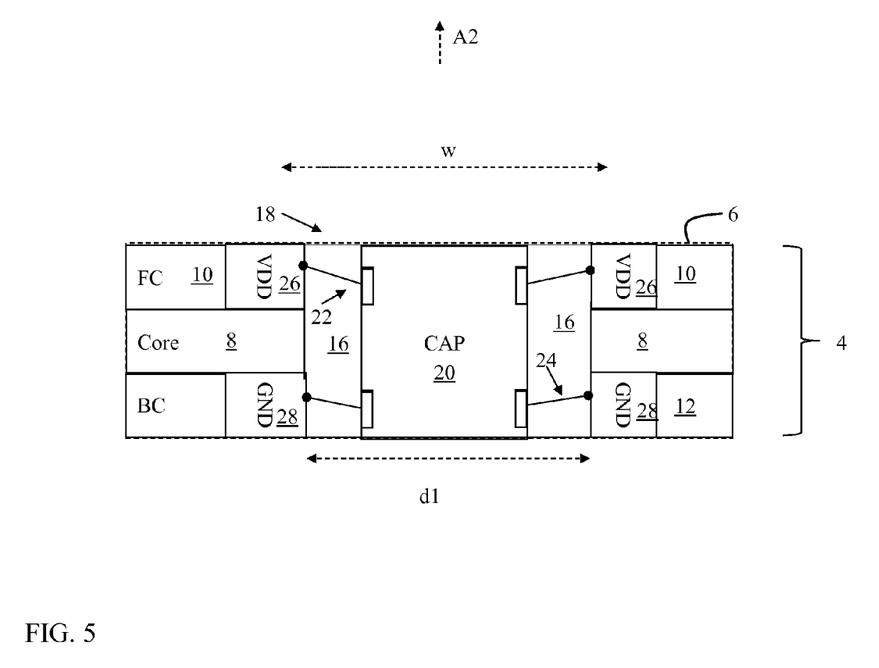
Figure 6:
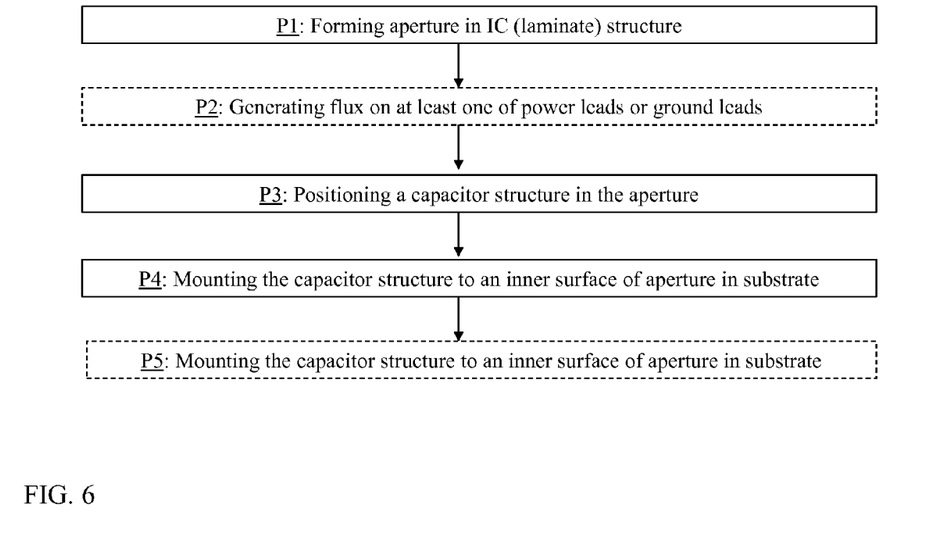
FIG. 6 depicts a flow diagram illustrating processes according to various embodiments.

FIGS. 3-5 include cross-sectional views of structures illustrating processes in forming IC structures (e.g., IC structure 2 and/or IC structure 202) according to various embodiments. FIG. 6 shows a flow diagram illustrating some of the processes used to form an IC structure that are illustrated in FIGS. 3-5. Reference is made to FIGS. 1-6, concurrently, with respect to the following processes:

Process P1: forming an aperture 16 in an integrated circuit (IC) laminate structure 2, the IC (laminate) structure 2 including: a substrate (e.g., laminate) layer 4 having an upper surface 6. In various embodiments, the aperture 16 is formed by conventional masking and etching, drilling, or boring of the substrate layer 4. In various embodiments, the aperture 16 is substantially rounded (e.g., circular). While in some embodiments the aperture 16 is substantially rounded, it is understood that in various other embodiments, the aperture 16 can be oval, square, rectangular, or have another shape when viewed from the plan view shown in FIG. 1. In various embodiments, the IC (laminate) structure 2 includes an IC chip 14 overlying (e.g., mounted on) the substrate layer 4 and aligned with a minor axis A1 perpendicular to the upper surface 6 of the substrate layer 4. According to various embodiments, the aperture 16 is formed such that the aperture 16 is physically separated from the IC chip 14 and is aligned with a distinct axis A2 perpendicular to the upper surface 6 of the substrate layer 4 that is offset from the minor axis A1 of the IC chip 14. Following forming of the aperture 16, the process can include:

Process P2 (optional process): applying a flux on at least one of the set of power leads 22 or the set of ground leads 24, and/or contacts 26 or 28. This process can include applying an organic acid to the leads 22, 24 (and/or contacts 26, 28) that improves solderability of those metal parts.

Process P3 (following process P1, and in some cases, P2): positioning a capacitor structure 18 in the aperture 16 such that at least a portion of the capacitor structure 18 is located below the upper surface 6 of the substrate layer 4 and the capacitor structure 18 is physically isolated from the IC chip 14. This process is illustrated in FIGS. 3-5. According to various embodiments, the process of positioning the capacitor structure 18 includes inserting the capacitor structure 18 into the aperture 16, e.g., at a depth that is coplanar with or below the bottom of the IC chip 14 on the substrate layer 4. It is understood that as described herein, the positioning (process P2) can be performed after assembly of the IC chip 14 onto the upper surface 6 of the substrate layer 4; that is, post-assembly of the IC chip 14 and the substrate (e.g., laminate) layer 4.

According to various embodiments, when process P2 is utilized to apply the flux on the set of power leads 22 and/or the set of ground leads 24 (and/or power contact 26 and/or ground contact 28), the process of positioning (process P3) can include coupling the at least one of the set of power leads 22 or the set of ground leads 24 to at least one of the power contact 26 or the ground contact 28 within the aperture using the solder (via flux). In these cases, the solder may be introduced by pre-coating the leads 22, 24 or contacts 26, 28 with solder. The solder can include at least one of SnCu or SnAg.

According to various additional (and not mutually exclusive) embodiments, the positioning (process P3) can include inserting the capacitor structure 18 into the aperture 16 such that at least one of the set of power leads 22 or the set of ground leads 24 contacts the inner surface 33 of the aperture 16 and retains the capacitor structure 18 within the aperture 16. FIGS. 4-5 illustrate that a combined width w of the capacitor 20 and the set of power leads 22, or a combined width of the capacitor 20 and the set of ground leads 24, is greater than the diameter d1 of the aperture 16, and when the capacitor structure 18 is inserted into the aperture 16, at least one of the set of power leads 22 or the set of ground leads 24 at least partially deflects in response to the contacting of the inner surface 33. The tension between the power leads 22 and/or ground leads 24 can couple the capacitor structure to the inner surface 33 of the aperture 16, e.g., via mechanical retention.

Following process P3, process P4 can include: mounting the capacitor structure 18 to an inner surface 33 of the aperture 16 after positioning of the capacitor structure 18 in the aperture 16. In various embodiments, the inner surface 33 includes a power contact 26 and a ground contact 28. In some cases, the mounting (process P4) includes heating (e.g., localized heating such as soldering) the at least one of the set of power leads 22 or the set of ground leads 24 to bond the at least one of the set of power leads 22 or the set of ground leads 24 to the at least one of the power contact 26 or the ground contact 28. In other cases, the mounting includes heating the capacitor structure 18 (and the IC structure 2) in an oven or other baking device to bond the set of power leads 22 and the set of ground leads 24 to the inner surface 33 (at the contacts 26, 28) of the aperture 16.

According to various embodiments, an additional (optional) process (process P5) can include positioning an additional capacitor structure 210 (FIG. 2) in the aperture 16 with the capacitor structure 18 such that at least a portion of the additional capacitor structure 210 is located below the upper surface 6 of the substrate (e.g., laminate) layer 4, and the additional capacitor structure 210 is physically isolated from the IC chip 14.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method comprising:
    forming an aperture in an integrated circuit (IC) structure, the IC structure including:
        a substrate layer having an upper surface; and
        an IC chip at least partially contained within the substrate layer and aligned with a minor axis perpendicular to the upper surface of the substrate layer,
    wherein the aperture is physically separated from the IC chip and is aligned with an axis perpendicular to the upper surface of the substrate layer and offset from the minor axis of the IC chip; and
    positioning a capacitor structure in the aperture such that at least a portion of the capacitor structure is located below the upper surface of the substrate layer and the capacitor structure is physically isolated from the IC chip.

2. The method of claim 1, wherein the positioning includes inserting the capacitor structure into the aperture at a depth coplanar with a depth of the IC chip in the laminate layer, and wherein the substrate layer includes a laminate layer.

3. The method of claim 1, wherein the positioning is performed after assembly of the IC chip in the substrate layer.

4. The method of claim 1, further comprising mounting the capacitor structure to an inner surface of the aperture after the positioning, the inner surface including a power contact and a ground contact.

5. The method of claim 4, wherein the capacitor structure includes:
    a capacitor;
    a set of power leads extending from the capacitor; and
    a set of ground leads extending from the capacitor,
    the method further comprising applying a flux to at least one of the set of power leads or the set of ground leads prior to the positioning,
    wherein the positioning includes coupling the at least one of the set of power leads or the set of ground leads to at least one of the power contact or the ground contact within the aperture using the flux, and
    wherein the mounting includes heating the at least one of the set of power leads or the set of ground leads to bond the at least one of the set of power leads or the set of ground leads to the at least one of the power contact or the ground contact.

6. The method of claim 4, wherein the capacitor structure includes:
    a capacitor;
    a set of power leads extending from the capacitor; and
    a set of ground leads extending from the capacitor,
    wherein the aperture has a diameter, and wherein a combined width of the capacitor and the set of power leads, or a combined width of the capacitor and the set of ground leads, is greater than the diameter of the aperture, and
    wherein the positioning includes inserting the capacitor structure into the aperture such that at least one of the set of power leads or the set of ground leads contacts the inner surface of the aperture and retains the capacitor structure within the aperture.

7. The method of claim 6, wherein the at least one of the set of power leads or the set of ground leads at least partially deflects in response to the contacting of the inner surface.

8. The method of claim 6, wherein the mounting includes heating the capacitor structure to bond the set of power leads and the set of ground leads to the inner surface of the aperture.

9. The method of claim 4, further comprising positioning an additional capacitor structure in the aperture with the capacitor structure such that at least a portion of the additional capacitor structure is located below the upper surface of the substrate layer and the additional capacitor structure is physically isolated from the IC chip.

* * * * *